United States Patent [19]

Mejia

[11] Patent Number: 5,872,529
[45] Date of Patent: Feb. 16, 1999

[54] DYNAMIC DATASTREAM COMPRESSION/ DECOMPRESSION

[75] Inventor: Manuel M. Mejia, San Jose, Calif.

[73] Assignee: Altera Corporation, San Jose, Calif.

[21] Appl. No.: 895,097

[22] Filed: Jul. 16, 1997

Related U.S. Application Data

[60] Provisional application No. 60/022,121 Jul. 18, 1996.

[51] Int. Cl.$^6$ ..................................................... H03M 7/00
[52] U.S. Cl. ............................................................. 341/59
[58] Field of Search .................................. 341/59, 65, 51, 341/106

[56] References Cited

U.S. PATENT DOCUMENTS 5,680,129  10/1997  Weinberger et al. ..................... 341/65

*Primary Examiner*—Brian Young
*Attorney, Agent, or Firm*—Townsend & Townsend & Crew LLP

[57] ABSTRACT

A dynamic run-length encoding scheme compresses data streams more effectively than conventional run-length encoding, which uses a fixed group length for encoding. With dynamic compression according to the invention, the group length is dynamically modified by the bitstream itself. This allows for greater efficiency in compression. As with run-length encoding, the actual compression ratio is a function of the particular bitstream. However, for identical bitstreams, the invention achieves greater compression than run-length encoding. The invention has applications in compressing data that is used to program a programmable logic device, thereby effectively increasing the capacity of storage, such as Serial EPROM's, used for PLD programming files.

17 Claims, 4 Drawing Sheets

DYNAMIC DATASTREAM COMPRESSION/ DECOMPRESSION

BACKGROUND OF THE INVENTION

This application claims benefit of priority from provisional patent application 60/022,121, filed Jul. 17, 1996 and incorporated herein by reference.

The present invention relates to the field of data processing. In particular, it relates to the use of data compression in programming programmable logic devices.

Coassigned U.S. Pat. No. 5,563,592, entitled, PROGRAMMABLE LOGIC DEVICE HAVING A COMPRESSED CONFIGURATION FILE AND ASSOCIATED DECOMPRESSION and incorporated herein by reference to the extent necessary to understand the invention, discusses the desirability of using run-length encoding and decoding schemes for compressing the amount of configuration data that must be stored in order to program a programmable logic device. Run-length encoding has many applications. In programmable logic devices, however, one application for run length encoding allows the encoding to be done in a computationally intensive way in software, while the decoding is performed in a simple way on circuitry connected to the programmable logic device.

As the complexity of the programmable logic devices grows, so does the number of programmable elements used requiring configuration files with a greater number of "1s" and "0s" to program the programmable memory devices. As the size of the configuration files increases, so does the size of the EPROMs needed to store them. Large EPROMs are expensive and require large silicon area to be manufactured. The size of the silicon area is more important when the EPROM is manufactured on the same substrate as the programmable logic device. The size of the EPROMs limit the complexity of the programmable logic device.

What is needed is an apparatus and method for further reducing the size of the configuration files used in a programmable logic device before they are stored in memory. Such techniques have applications in other areas where run-length encoding is desirable.

SUMMARY OF THE INVENTION

The present invention is a method and apparatus to run-length compress binary data file using a technique that results is smaller compressed files than previously possible. The compressed data file may then be stored in a memory element or used otherwise.

One application of the present invention is storing the data files used to configure a programmable logic device (PLD). When used for programming a programmable logic device, the compressed data file may be decompressed on the programmable logic device or an associated memory chip and then used to program the programmable logic device. In one embodiment of the present invention, the compression is done by software means and the decompression is done by hardware. The present invention may be used in conjunction with the invention in U.S. Pat. No. 5,563,592 or in other applications.

Therefore, the present invention offers a solution to the problems caused by large memory patterns that are used in programming programmable logic devices and in other applications.

According to the invention, sequences of consecutive bits are run length encoded. In general in prior art systems, if N bits are used to encode the length of a particular sequence, then the maximum sequence length than can be represented by N bits is $2^N$. According to the invention, the number of bits used to encode the length of sequences of ones is independent of the number of bits used to encode the length of sequences of zeros. The reason for this is that in bitstreams of interest, most of the sequences of ones have very short lengths, whereas the sequences of zeros have lengths which vary from very small to very large. By choosing different N's for zeros and ones, the invention is able to independently optimize the compression encoding. Furthermore, since the sequence lengths of zeros are so widely distributed, it is advantageous, according to a second embodiment, to use two different N's for encoding zeros.

In order to avoid having to insert an extra bit indicating whether a one or a zero is represented by the following N bits, one embodiment of the invention assumes that the sequence being represented alternates between ones and zeros. This assumption only holds for those sequence lengths which are less than $2^N$. Whenever the sequence length is greater than or equal to $2^N$, there is a need to insert an extra bit specifying what sequence the next bits are going to represent.

Because the invention uses two different N's to represent zeros, the invention also needs to set aside a certain flag to specify when the invention will be using the alternate N for representing zeros. In one embodiment, for ones the number $2^N-1$ is a flag indicating that the following bit specifies what bit sequence is encoded next. For zeros, the number $2^N-2$ is a flag indicating that the following bit specifies what bit sequence is encoded next and number $2^N-1$ is a flag indicating that the following bit sequence is encoded using the alternate N. Also, the very first bit of the encoded bitstream will indicate whether the first sequence is ones or zeros. Other designations of specific values as flags are signals to the decode routine are possible according to the invention.

For the purposes of clarity, the compression and decompression technique of the invention will be discussed in terms of binary files and binary data. However, the technique of the invention is generalizable to any data stream consisting of discreet units of values that are susceptible of and form of run-length encoding and the invention therefore should not be seen as limited to the example data streams and encoding discussed herein.

DETAILED DESCRIPTION OF THE DRAWINGS

Figure 1:
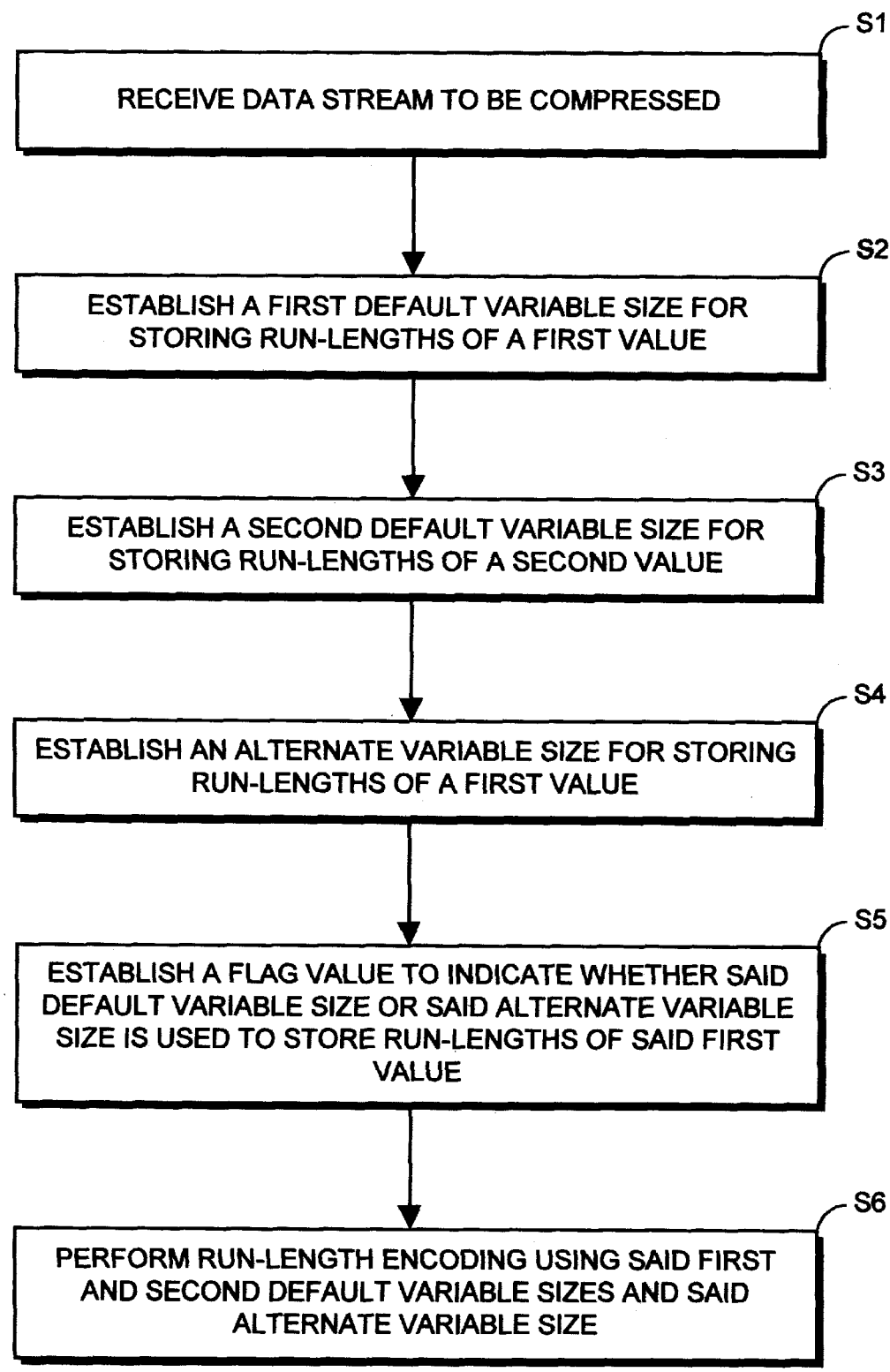
FIG. 1 is a flow chart illustrating a method of the invention.

The invention may be further understood in light of the following example.

To illustrate the method, assume that 3 is the default N chosen to encode zeros; 5 is the alternate N chosen to encode zeros; and 2 is the default N chosen to encode ones. The N's can be optimized for any particular bitstream and then passed along to the decoding unit, be it hardware or software, in the form of header information.

As an example, bitstream U would be encoded as bitstream C as indicated below, with each of the encoding fields interpreted as in Table 1.

TABLE 1

| (U) | 00 | 111 |     | 00000000000000000000 | 1  | 0000000 | 1   | 0   |
|-----|----|-----|-----|----------------------|----|---------|-----|-----|
| (C) | 0 001 | 10 | 111 | 10100                |    | 00 110  | 1 00 | 000 |

Encoding Table

| | |
|---|---|
| 0 | first sequence is zeros; |
| 001 | 2 zeros; |
| 10 | 3 ones; |
| 111 | use alternate N for zeros; |
| 10100 | 20 zeros; |
| 00 | 1 one; |
| 110 | 7 zeros; |
| 1 | next sequence is ones; |
| 00 | 1 one; |
| 000 | 1 zero; |

Decoding of a bitstream according to one embodiment of the invention may be understood with reference to the Tables 2–4.

TABLE 2

Decode Table for ones

| | |
|---|---|
| 00 —> 1 | Next sequence is zeros |
| 01 —> 11 | Next sequence is zeros |
| 10 —> 111 | Next sequence is zeros |
| 11 —> 1111 | Read next bit to determine what next sequence is |

TABLE 3

Decode Table for zeros (default N = 3)

| | |
|---|---|
| 000 —> 0 | Next sequence is ones; |
| 001 —> 00 | Next sequence is ones; |
| 010 —> 000 | Next sequence is ones; |
| 011 —> 0000 | Next sequence is ones; |
| 100 —> 00000 | Next sequence is ones; |
| 101 —> 000000 | Next sequence is ones; |
| 110 —> 0000000 | Read next bit to determine what next sequence is; |
| 111 —> | Use alternate N to decipher zeros. |

TABLE 4

Decode Table for zeros (alternate N = 5)

| | |
|---|---|
| 00000 —> 0, | Next sequence is ones; |
| 00001 —> 00, | Next sequence is ones; |
| 00010 —> 000, | Next sequence is ones; |
| . | |
| . | |
| 11110 —> 00 ... 00 (31 zeros), | Read next bit to determine what next sequence is. |
| 11111 —> | Illegal |

Encoding and Decoding Algorithm

The following is a more detailed description of encoding according to one embodiment of the invention, expressed in notation that is a mixture of mathematics and programming pseudo-code. The only notation which may not be familiar is the ceiling function represented by $\lceil x \rceil$. The value of this expression is the least integral value greater than or equal to x.

Encoding Algorithm

Encoding according to the invention has been best found to be done in software due to its complexity, though hardware implementations are possible. According to one embodiment, the encoding is completed in software and the decoding in hardware, which may be associated with an E-PROM chip. In the description of the example below, the constants and variables are defined as follows:

- i—default number of bits in group used to encode zeros
- j—alternate number of bits in group used to encode zeros
- k—number of bits in group used to encode ones
- dataIn—data stream to be encoded
- encodedData—data stream output by encoding unit
- currentBit—current bit being encoded
- consecBits—number of consecutive bits found
- numEncodingBits—number of bits to use for encoding currentBit
- bitsWithI—number of bits used to represent sequence of consecutive bits if number of bits in group is i.
- bitsWithJ—number of bits used to represent sequence of consecutive bits if number of bits in group is j.

The following pseudo-code establishes encoding according to the invention and determines which number of bits is most efficient for represent a particular sequence of consecutive bits. If the consecutive bits are ones, then there is only one choice: k. If the bits are zeros then either i bits or j bits can be used. i is the default number of bits, but for particularly long sequences it may be more efficient to use j bits although this requires wasting i bits to signal use of the alternate number of bits.

1) set encodedData equal to first bit of bitstream dataIn
2) Count number of consecutive bits, store in variable consecBits
3) Set numEncodingBits according to consecBits and currentBit.
   a) if (currentBit==1) then numEncodingBits=k
   b) if (currentBit==0) then bitsWithI=$\lceil$(consecBits+1)/$2^i \rceil$*(i+1);
      if ((consecBits+1) mod $2^i$!=0) then bitsWithI= bitsWithI−1 bitsWithJ=$\lceil$(consecBits+1)/$2^j \rceil$*(j+1)+i
      if ((consecBits+1) mod $2^j$!=0) then bitsWithJ= bitsWithJ−1
      if (bitsWithI<=bitsWithJ) then numEncodingBits=i else numEncodingBits=j
4) set EncodedData equal to binary number for consecBits, six scenarios possible.
   if (currentBit==1) then
   a) consecBits is less than $2^{numEncodingBits}$: encodedData=binary representation for consecBits−1 b) consecBits is equal to $2^{numEncodingBits}$:
   encodedData=binary representation for consecBits-1
   encodedData=0
c) consecBits is greater than $2^{numEncodingBits}$:
   encodedData=binary representation for $2^{numEncodingBits}-1$
   encodedData=1
   consecBits=consecBits-($2^{numEncodingBits}$)
   go back to step 4
if (currentBit==0) then
d) consecBits is less than $2^{numEncodingBits}-1$:
   encodedData=binary representation for consecBits-1
e) consecBits is equal to $2^{numEncodingBits}-1$:
   encodedData=binary representation for consecBits-1
   encodedData=1
f) consecBits is greater than $2^{numEncodingBits}-1$:
   encodedData=binary representation for $2^{numEncodingBits}-2$
   encodedData=0
   consecBits=consecBits-($2^{numEncodingBits}-1$)
   go back to step 4

5) If there are more bits left to encode, go back to step 2, otherwise you are done.

FIG. 1 is a flow chart outlining in general terms the method of the invention.

Serial EPROM with Dynamic Bitstream Decompression

Figure 2:
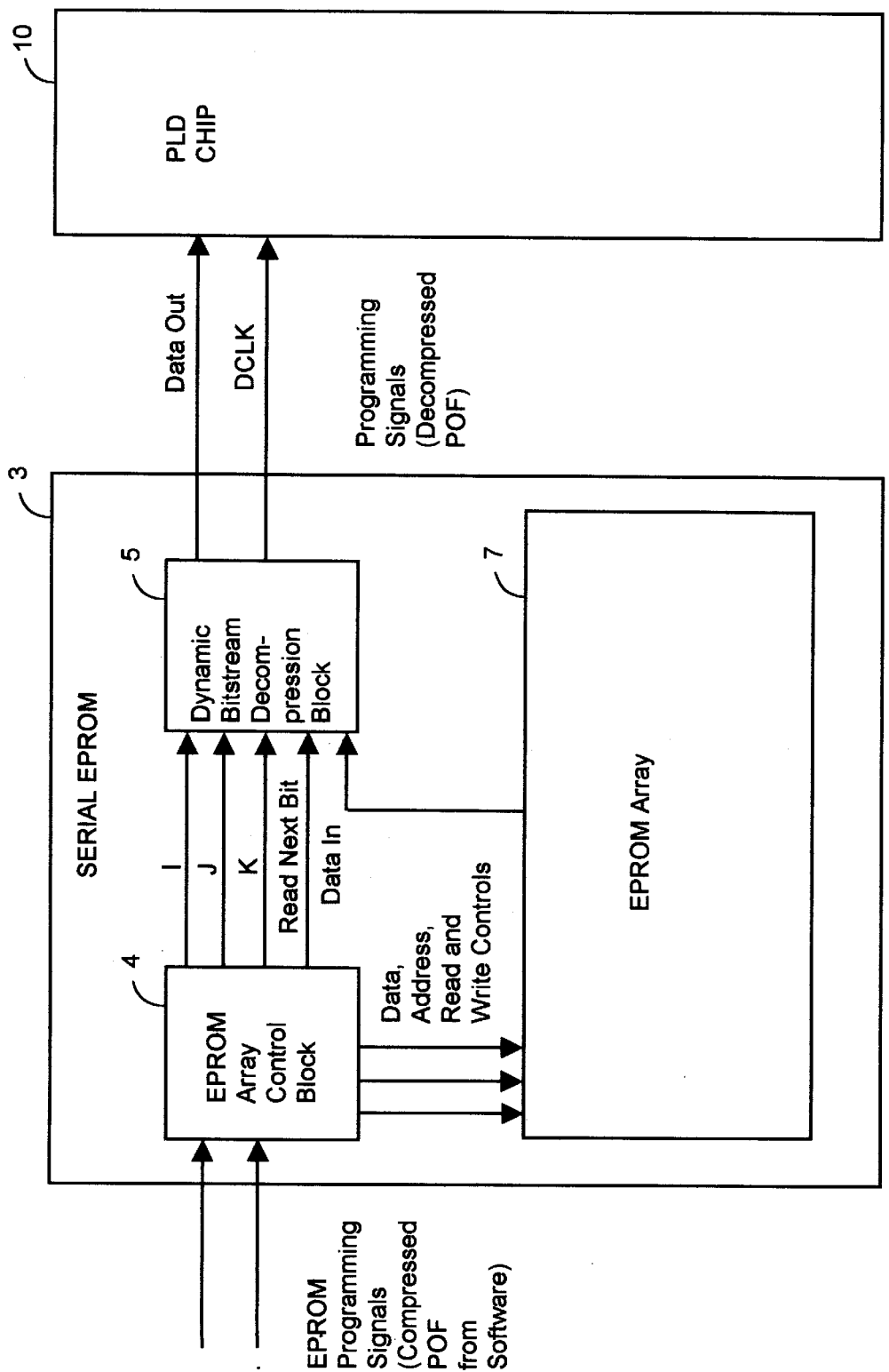
FIG. 2 is a serial EPROM with Dynamic Bitstream Decompression showing one environment in which the invention may be employed.

In one embodiment, because Dynamic Bitstream Decompression hardware is not very large, it is included on the same chip which holds the EPROM Array or other memory storage as illustrated in FIG. 2. Therefore, ideally, software provides a compressed configuration file (POF) to the Serial EPROM Array 7 through a control block 4. The Serial EPROM 3 then stores the compressed POF in its EPROM Array 7. When data needs to be read out from the Serial EPROM, it passes through the Dynamic Bitstream Decompression Block (DBDB) 5 which decompresses the POF and supplies the programming data to PLD 10.

Dynamic Bitstream Decompression Block

Figure 3:
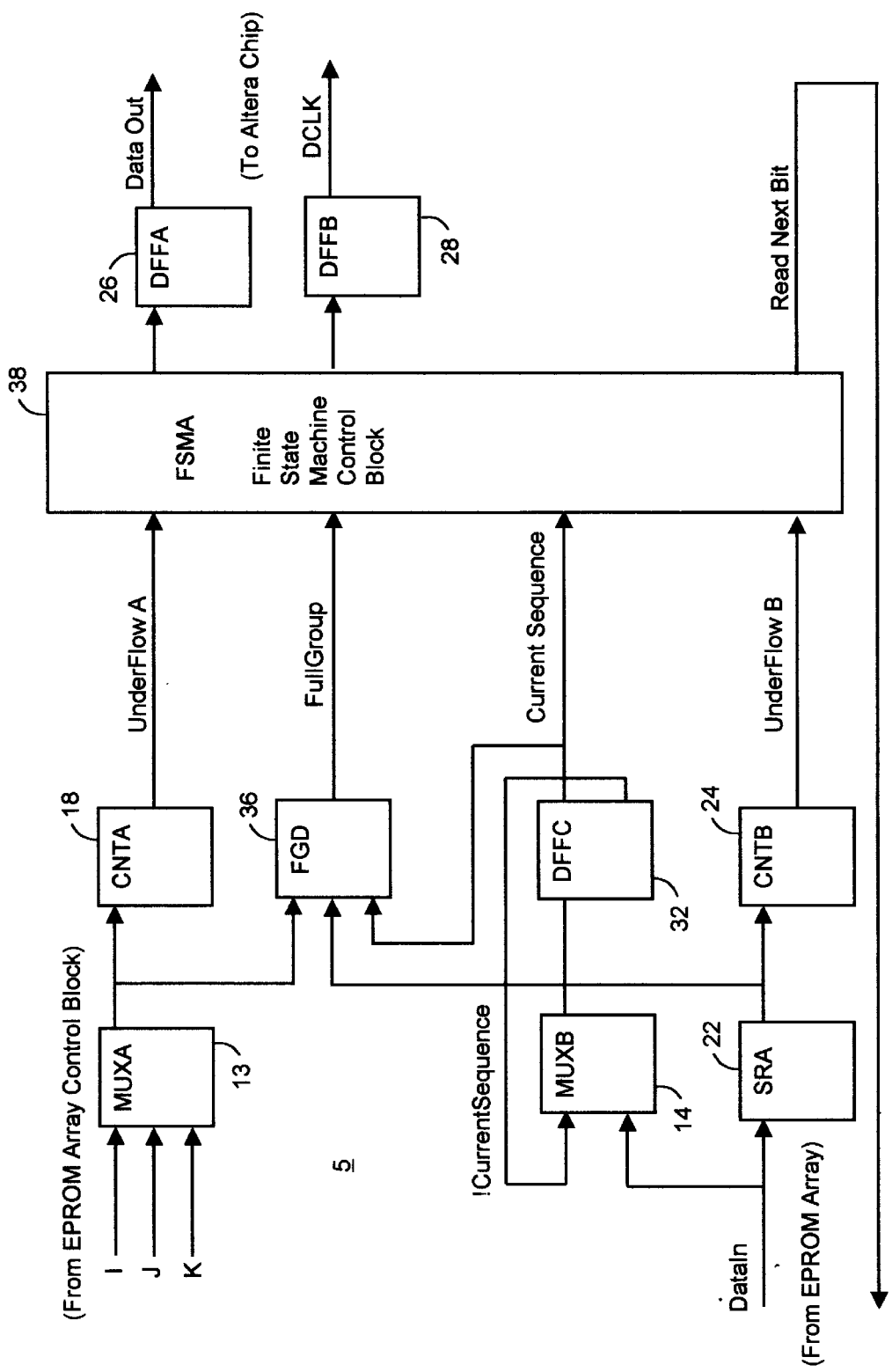
FIG. 3 is a block diagram of an example circuit for performing Dynamic Bitstream Decompression according to the invention.
Figure 4:
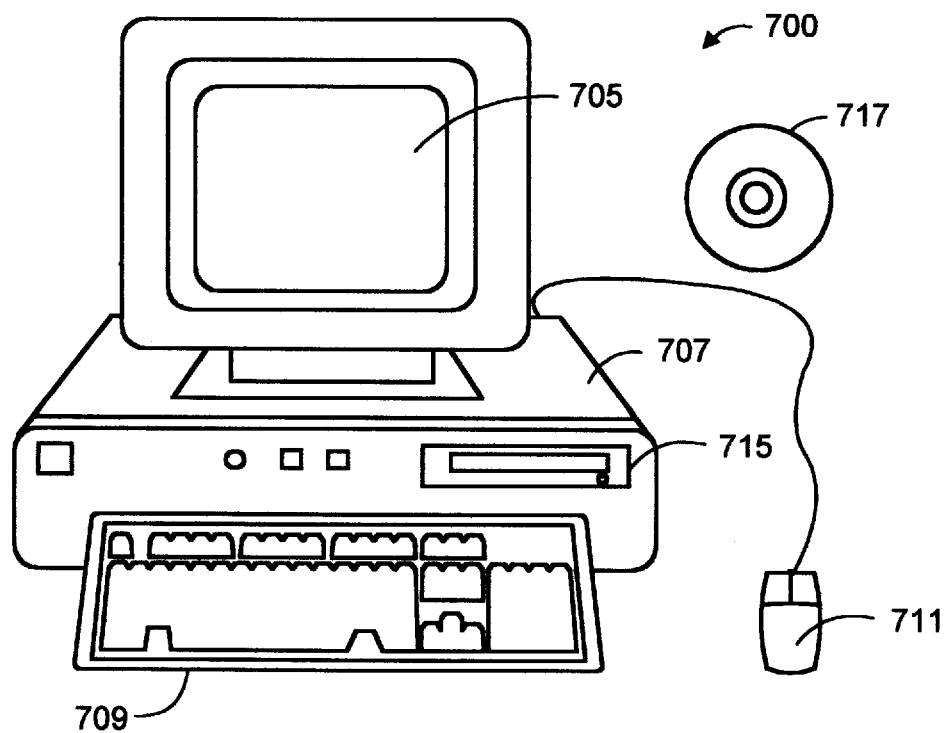
FIG. 4 is a block diagram of a computer system incorporating the invention.

FIG. 3 illustrates a Dynamic Bitstream Decompression Block 5 according to one embodiment of the invention.

Decompression, as expected, follows a functional reversal of the algorithm as compression as described below. The DBDB 5 works on groups of bits which represent the lengths of the sequences. Each group is read serially from the EPROM array and parallelized by Shift Register SRA 22. Down counter CNTB 24 is loaded with the contents of SRA 22 and is used to generate as many DCLK cycles as specified by the group. While DCLK is toggling, DataOut holds the value of the sequence. Together, DCLK and DataOut represent the decompressed POF and can be used directly to program a PLD.

The number of bits read in from the EPROM array for any particular group is controlled by MUXA 13 and counter CNTA 18. MUXA 13 selects how many bits are in the group, depending on what the previous sequence was and whether the group was "full" as detected by block FGD 36. The current sequence is stored internally in flip-flop DFFC 32 and alternates between 1 and 0, except when the group is full, in which case the current sequence is read in from the EPROM array. When a group has been decompressed, the DBDB 5 requests the next group from the EPROM array until all the groups have been processed.

In the diagram shown in FIG. 3, assume that the maximum number of encoding bits in any particular group is 8. This number is arbitrary, if it changes, all the widths of the following components will have to be scaled accordingly.

In FIG. 3, the constants supplied by external logic are represented by I, J, and K as follows:

I—default number of bits in group used to encode zeros;
J—alternate number of bits in group used to encode zeros;
K—number of bits in group used to encode ones.

The circuit components shown in FIG. 3 may be understood as follows:

MUXA 13—3 bit wide, 3-to-1 Mux. Selects between I, J and K.

MUXB 14—2-to-1 Mux. Selects between !CurrentSequence or DataIn.

CNTA 18—3 bit Loadable Down Counter. This counter controls how many bits are read in from the EPROM Array. For example, if the invention is decoding ones, and K holds the value 010 this means the number of bits used to encode ones is 2, and therefore we should read in the next 2 bits from the EPROM array.

SRA 22—8 bit Shift Register. This register holds up to 8 bits read in from the EPROM Array. The contents of this register will be loaded into CNTB 24.

DFFA 26—D Flip-Flop. Holds the value for the next sequence. This output of this flip-flop, DataOut, can be used directly to program PLD chips.

DFFB 28—D Flip-Flop. Holds the value for DCLK. This signal, together with DataOut, are the decompressed values for the bitstream.

DFFC 32—D Flip-Flop. Internally holds the value of the next sequence. This flip-flop is different than DFFA 26 because this flip-flop is used by FSMA 38 to determine what sequence is currently being decoded.

CNTB 24—8 bit Loadable Down Counter. This counter is loaded from SRA 22 and determines the length for a particular sequence. It does this by controlling how many DCLK's are issued for any particular DataOut value.

FGD 36—Full Group Detect—This block detects when a group is full, based on the values of CurrentSequence and MUXA 13. For example, if CurrentSequence is 0, MUXA 13 is I, and SRA 22 is $2^I-2$, this would indicate that the group is full and that we need to read one bit from the EPROM array in order to determine what the next sequence will be.

FSMA 38—Finite State Machine. This block provides the control signals for all the above components.

Following are steps followed by the state machine during operation, assuming I=5, J=3, K=2:

1) Read in one bit from the EPROM array by setting ReadNextBit high. Load DFFC 32 with DataIn by setting MUXB 14 appropriately. This will determine what the next sequence will be.

2) In MUXA 13, select between I, J, and K. If CurrentSequence is 1 choose K, if CurrentSequence is 0 choose I.

3) Load down counter CNTA 18 with value of MUXA 13.

4) Enable CNTA 18 to start down counting. As long as CNTA 18 has a non-zero value, read in a bit from EPROM array. Shift bit into SRA 22. When CNTA 18 has finished counting (as indicated by UnderflowA), proceed to step 5.

5) Load value of SRA 22 into down counter CNTB 24.
6) If CurrentSequence is 0 and value of CNTB 24 is 111. This means that we will be using the alternate number of bits to encode zeros. Therefore, select MUXA 13 to choose J and proceed to step 3. Otherwise, proceed to step 7.
7) Set DataOut to be equal to CurrentSequence. As long as CNTB 24 has a non-zero value (as indicated by UnderflowB), issue one DCLK cycle. When step 7 is finished, there should one more DCLK cycle than value of CNTB 24 at the beginning of step 7. This is because a CNTB 24 value of 000 maps to a sequence length of 1.
8) Check to see whether CurrentSequence will read in from DataIn or from CurrentSequence. If FullGroup is 0, this means that the value of the next sequence will be the inverse of CurrentSequence, we then proceed to step 2. If FullGroup is 1, proceed to step 1.

Computer Readable Implementation

The present invention may be embodied in software instructions either recorded on a fixed or erasable media or transmitted electronically. In such a case, the instructions will cause the computer system to perform the method herein described. FIG. 7 illustrates an example of a computer system used to perform methods of the present invention. FIG. 7 shows a computer system 700 which includes a monitor 705, cabinet 707, keyboard 709, and mouse 711. Cabinet 707 houses a disk drive 715 for reading a CD-ROM or other type disk 717 and houses other familiar computer components (not shown) such as a processor, memory, disk drives, and the like, as well as an adaptor for connection to a communication channel.

As is well-know in the field of PLD design, computer system 700 may be used to generate and transmit configuration data to a PLD. Such a PLD may be an integrated component of system 700, which, after configuration, allows system 700 to perform some additional or advanced function, or system 700 may be a workstation which is only temporarily in communication with a PLD for purposes of programming that PLD. In either case, as described herein, system 700 may be provided with software allowing it to perform run-length compression according to the invention. Once the compressed configuration file is generated, it will be stored either at system 700 or more likely on a serial EPROM closely linked to or residing on the same chip as, the PLD. The compressed configuration file is then decompressed and used to program the PLD. As explained herein, the decompression may take place in hardware closely integrated with the PLD, a serial PROM, or both.

The invention has now been explained with reference to specific embodiments. However, a number of variations to the invention will be obvious to anyone with skill in the art. For example, the invention need not be limited to circuits that are commonly thought of as PLDs; other types of configurable counter circuits or adder circuits may employ the invention. Systems incorporating the invention may be any type of information processing system or subsystem. Also, in a number of places specific steps are described by way of examples using example values and in a specific order. It will be apparent to those of skill in the art that in many instances, largely equivalent functionality can be accomplished while performing steps of the invention in a different order. It is therefore intended that the invention not be limited except as specified in the attached claims.

What is claimed is:

1. A method of dynamic run length compression of a data stream, said data stream comprised of data units having at least two different values, herein designated A and B, comprising:
    establishing a first default variable size for encoding run lengths for A values;
    establishing a second default variable size for encoding run lengths for B values, wherein said second default variable size is different from said first default variable size; and
    compressing said data stream, using said first and second default variable sizes to encode run lengths of A values and B values.
2. The method according to claim 1 further comprising:
    establishing a first flag in said first default variable size for indicating that a next encoded data value may be other than an expected value; and
    establishing a second flag in said second default variable size for indicating that a next encoded data value may be other than an expected value.
3. The method according to claim 2 wherein said first flag indicates that a subsequent field in an encoded data stream must be examined to determine the next data value.
4. The method according to claim 1 further comprising:
    establishing a first alternate variable size for encoding run lengths for A values.
5. The method according to claim 4 further comprising:
    establishing a first alternate flag in said first default variable size for indicating that a next encoded data value will use said alternate variable size.
6. The method according to claim 1 wherein said A bit sequences are expected to occur in more varied sequences than said B bit sequences.
7. The method according to claim 1 further comprising:
    storing the resulting compressed data stream into a memory used for configuring a programmable logic device (PLD);
    retrieving said stored compressed data stream;
    uncompressing said compressed data to regenerate said data stream; and
    programming said programmable logic device using said data stream.
8. A fixed computer readable medium containing computer executable program, which, when loaded into an appropriately configured computer system will cause the computer to perform the method of claim 1.
9. A method of dynamic run length compression of a data stream, said data stream comprised of data units having at least two different values, herein designated A and B, comprising:
    establishing a first default variable size of I bits for encoding run lengths for A values;
    establishing a second default variable size of K bits for encoding run lengths for B values, wherein said second default variable size is different from said first default variable size; and
    compressing said data stream, using said first and second default variable sizes to encode run lengths of A values and B values.
10. The method according to claim 9 further comprising:
    establishing a first flag equal to $2^I-2$ in said first default variable size for indicating that a following bit will determine the value of the next encoded data field; and establishing a second flag equal to $2^K-1$ in said second default variable size for indicating that a following bit will determine the value of the next encoded data field.

11. The method according to claim 9 further comprising:

establishing a first alternate variable size of J bits for encoding run lengths for A values.

12. The method according to claim 11 further comprising:

establishing a first alternate flag equal to $2^J-1$ in said first default variable size for indicating that a next encoded data value will use said alternate variable size.

13. The method according to claim 1 wherein said A bit sequences are expected to occur in more varied lengths than said B bit sequences.

14. The method according to claim 1 further comprising:

storing the resulting compressed data stream into a memory used for configuring a programmable logic device (PLD);

retrieving said stored compressed data stream;

uncompressing said compressed data to regenerate said data stream; and programming said programmable logic device using said data stream.

15. A fixed computer readable medium containing computer executable program, which, when loaded into an appropriately configured computer system will cause the computer to perform the method of claim 1.

16. A method for dynamic run length encoding, creating an encoded data stream encodedData from a data stream dataIn where i represents a default number of bits used to encode dataIn fields of a first value, j represents an alternate number of bits used to encode dataIn fields of a first value, k represents a default number of bits used to encode dataIn fields of a second value, comprising:

(a) setting the first bit in encodedData according to the first value in dataIn;

(b) counting the number of consecutive matching values in dataIn and storing count in a variable consecBits (c) setting a numEncodingBits variable as follows:

if current dataIn field=second value then numEncodingBits=k if current dataIn field=first value then bitsWithI=⌈(consecBits+1)/$2^i$⌉* (i+1) and then if ((consecBits+1) mod $2^i$!=0) then bitsWithI=bitsWithI−1, bitsWithJ=⌈(consecBits+1)/$2^j$⌉* (j+1)+i if ((consecBits+1) mod $2^j$!=0) then bitsWithJ=bitsWithJ−1;

if (bitsWithI<=bitsWithJ) then numEncodingBits=i else numEncodingBits=j (d) setting next field(s) in EncodedData equal to binary number for consecBits according to one of the six following possibilities:

if (currentBit==second value) then
   if consecBits<$2^{numEncodingBits}$
      encodedData=consecBits−1
   if consecBits $2^{numEncodingBits}$
      encodedData=consecBits−1
      encodedData indication of first value
   if consecBits>$2^{numEncodingBits}$
      encodedData=$2^{numEncodingBits}$−1
      encodedData=indication of second value
      consecBits=consecBits−($2^{numEncodingBits}$)
      go back to setting next field(s) step;

if (currentBit==first value) then
   if consecBits<$2^{numEncodingBits}$−1:
      encodedData=consecBits−1
   if consecBits=$2^{numEncodingBits}$−1:
      encodedData=consecBits−1
      encodedData=indication of second value
   if consecBits is>$2^{numEncodingBits}$−1:
      encodedData=$2^{numEncodingBits}$−2
      encodedData=indication of first value
      consecBits=consecBits−($2^{numEncodingBits}$−1)
      go back to setting next field(s) step; and (e) if there are more bits left to encode, go back to second step.

17. A circuit for supplying a configuration data stream to a programmable logic device comprising:

a first multiplexer selecting between default encoding variable size values;

a second multiplexer to select between a new data field and a currently decoding sequence;

a first counter controlling how many bits are read in from a memory array;

a shift register to hold data read in from the memory array, the contents of which are loaded into a second counter;

an output flip-flop holding the value for the next decoded sequence which may be used directly to program PLD chips;

a second counter loaded from said shift register for determining the length for a particular sequence by controlling the number of data clocks issued for any particular output value;

a full group detect for detecting when a group is full;

a finite state machine providing control signals.

\* \* \* \* \*

UNITED STATES PATENT AND TRADEMARK OFFICE
CERTIFICATE OF CORRECTION

PATENT NO. : 5,872,529
DATED : February 16, 1999
INVENTOR(S) : Manuel M. Mejia

It is certified that error appears in the above-identified patent and that said Letters Patent is hereby corrected as shown below:

IN THE CLAIMS:

Claim 16, column 10, line 7, replace "if consecBits$2^{numEncodingBits}$" to --if consecBits = $2^{numEncodingBits}$.

Claim 16, column 10, line 9, replace "encodedData indication of first value" with --encodedData = indication of first value--.

Signed and Sealed this

Twentieth Day of July, 1999

Attest:

Q. TODD DICKINSON

Attesting Officer

Acting Commissioner of Patents and Trademarks